US011350547B2

(12) United States Patent
Orsini et al.

(10) Patent No.: US 11,350,547 B2
(45) Date of Patent: May 31, 2022

(54) USE OF COMPUTATIONALLY GENERATED THERMAL ENERGY

(71) Applicant: LO3 Energy Inc., Brooklyn, NY (US)

(72) Inventors: Lawrence Orsini, Brooklyn, NY (US); Yun Wei, Brooklyn, NY (US)

(73) Assignee: LO3 Energy Inc., San Francisco, CA (US)

( * ) Notice: Subject to any disclaimer, the term of this patent is extended or adjusted under 35 U.S.C. 154(b) by 36 days.

(21) Appl. No.: 16/658,759

(22) Filed: Oct. 21, 2019

(65) Prior Publication Data

US 2020/0120835 A1 Apr. 16, 2020

Related U.S. Application Data

(63) Continuation of application No. 15/299,969, filed on Oct. 21, 2016, now Pat. No. 10,485,144, which is a (Continued)

(51) Int. Cl.
*H05K 7/20* (2006.01)
*G06F 1/20* (2006.01)
(Continued)

(52) U.S. Cl.
CPC ......... *H05K 7/20836* (2013.01); *G05B 15/02* (2013.01); *G05B 19/048* (2013.01);
(Continued)

(58) Field of Classification Search
CPC .. H05K 7/20836; G05B 15/02; G05B 19/048; G05B 2219/49204; G06F 1/20; F24F 11/46
See application file for complete search history.

(56) References Cited

U.S. PATENT DOCUMENTS 6,317,321 B1 11/2001 Fitch et al.
7,907,406 B1 3/2011 Campbell
(Continued)

FOREIGN PATENT DOCUMENTS

CN 2 395 216 9/2000
CN 101782284 7/2010
(Continued)

OTHER PUBLICATIONS

International Search Report and Written Opinion, for App. No. PCT/US15/59028, dated Mar. 2, 2016, 6 pages.
(Continued)

*Primary Examiner* — Charles R Kasenge
(74) *Attorney, Agent, or Firm* — Fish & Richardson P.C.

(57) ABSTRACT

In one aspect, a computing device-implemented method includes receiving at least one triggering event signal from one or more components of a heat recovery system. The method also includes determining, based in part on the at least one triggering event signal, a computation workload assignment to be executed on one or more computation devices. The method further includes sending one or more command signals to the one or more computation devices. The one or more command signals include a portion of the computation workload assignment for execution by the one or more computation devices. The method also includes initiating capture of heat energy to be stored in one or more heat reservoirs, the heat energy being generated by the one or more computation device based upon the computation workload assignment.

28 Claims, 6 Drawing Sheets

Related U.S. Application Data continuation of application No. 14/932,585, filed on Nov. 4, 2015, now Pat. No. 9,480,188.

(60) Provisional application No. 62/074,810, filed on Nov. 4, 2014.

(51) Int. Cl.
*G05B 19/048* (2006.01)
*G05B 15/02* (2006.01)
*F24F 11/46* (2018.01)

(52) U.S. Cl.
CPC .............. *G06F 1/20* (2013.01); *F24F 11/46* (2018.01); *G05B 2219/49204* (2013.01)

(56) References Cited

U.S. PATENT DOCUMENTS

| | | | |
|---|---|---|---|
| 8,053,748 | B2 | 11/2011 | Shah |
| 8,212,230 | B2 | 7/2012 | Shah |
| 8,397,088 | B1 | 3/2013 | Ghose |
| 8,522,569 | B2 | 9/2013 | Avery et al. |
| 8,788,101 | B2 | 7/2014 | Pulley |
| 8,790,451 | B1 | 7/2014 | Narayanamurthy |
| 8,791,417 | B2 | 7/2014 | Scelzi |
| 8,941,256 | B1 | 1/2015 | Czamara |
| 9,382,817 | B2 | 7/2016 | Somani |
| 9,480,188 | B2 | 10/2016 | Orsini et al. |
| 9,608,284 | B2 | 3/2017 | Peterson |
| 9,933,804 | B2 | 4/2018 | Janous |
| 10,485,144 | B2 | 11/2019 | Orsini et al. |
| 2005/0280987 | A1 | 12/2005 | Kwitek et al. |
| 2006/0136076 | A1* | 6/2006 | Rotem ............... G05D 23/1934 700/44 |
| 2008/0211230 | A1 | 9/2008 | Gurin |
| 2009/0038668 | A1 | 2/2009 | Plaisted |
| 2009/0159866 | A1 | 6/2009 | Shah |
| 2010/0175851 | A1* | 7/2010 | Heydari ............... G06F 1/20 165/80.2 |
| 2010/0313204 | A1* | 12/2010 | Haugh ............... G06F 1/206 718/105 |
| 2011/0082601 | A1* | 4/2011 | Pulley ............... F24D 19/1009 700/300 |
| 2011/0096503 | A1 | 4/2011 | Avery et al. |
| 2011/0161294 | A1* | 6/2011 | Vengerov ............... G06F 16/275 707/637 |
| 2011/0238223 | A1 | 9/2011 | Narayanamurthy |
| 2011/0239671 | A1* | 10/2011 | Malone ............... H05K 7/2079 62/178 |
| 2011/0279968 | A1* | 11/2011 | Lin ............... G06F 1/203 361/679.47 |
| 2011/0281520 | A1* | 11/2011 | Lin ............... H01L 23/34 455/41.2 |
| 2011/0304966 | A1 | 12/2011 | Schrempp |
| 2012/0020150 | A1 | 1/2012 | Shah |
| 2012/0095615 | A1* | 4/2012 | Lin ............... G06F 1/1632 700/300 |
| 2012/0117411 | A1 | 5/2012 | Stanley-Marbell |
| 2012/0123596 | A1 | 5/2012 | Plaisted |
| 2012/0158190 | A1 | 6/2012 | Belady et al. |
| 2012/0211993 | A1 | 8/2012 | Pagliasotti |
| 2012/0227926 | A1 | 9/2012 | Field |
| 2012/0327590 | A1* | 12/2012 | Heydari ............... H01L 23/467 361/679.47 |
| 2013/0090888 | A1* | 4/2013 | Anderson ............... G06F 1/203 702/130 |
| 2013/0103214 | A1* | 4/2013 | Das ............... G05B 11/01 700/291 |
| 2013/0103218 | A1* | 4/2013 | Das ............... G05B 11/01 700/291 |
| 2013/0163193 | A1 | 6/2013 | Ballantine |
| 2013/0178999 | A1* | 7/2013 | Geissler ............ G05D 23/1934 700/300 |
| 2013/0238139 | A1 | 9/2013 | Boucher et al. |
| 2013/0328395 | A1 | 12/2013 | Krizman |
| 2014/0029196 | A1 | 1/2014 | Smith |
| 2014/0048235 | A1 | 2/2014 | Kamaludeen |
| 2014/0089699 | A1 | 3/2014 | O'Connor et al. |
| 2014/0260250 | A1 | 9/2014 | Oxner |
| 2014/0303787 | A1 | 10/2014 | Struckmeier et al. |
| 2015/0228004 | A1 | 8/2015 | Bednarek |
| 2015/0337691 | A1 | 11/2015 | Somani |
| 2015/0351286 | A1 | 12/2015 | Sakamoto |
| 2016/0011618 | A1 | 1/2016 | Janous |
| 2016/0019937 | A1 | 1/2016 | Arora |
| 2016/0036070 | A1 | 2/2016 | Peterson |
| 2016/0123620 | A1 | 5/2016 | Orsini |
| 2016/0290154 | A1 | 10/2016 | Somani |
| 2017/0042068 | A1 | 2/2017 | Orsini et al. |
| 2017/0198928 | A1 | 7/2017 | Magcale |
| 2018/0165660 | A1 | 6/2018 | High et al. |

FOREIGN PATENT DOCUMENTS

| | | |
|---|---|---|
| CN | 102396146 | 8/2014 |
| DE | 10 2005 021473 | 10/2006 |
| WO | 2014/082028 | 5/2014 |

OTHER PUBLICATIONS

International Preliminary Report on Patentability for App. No. PCT/US2015/059028, dated May 9, 2017, 6 pages.

Ebrahimi et al., A review of data center cooling technology, operating conditions and the corresponding low-grade waste heat recovery opportunities, *Renewable and Sustainable Energy Reviews*, Mar. 2014;31:622-638.

Mukherjee et al. "Spatio-temporal thermal-aware job scheduling to minimize energy consumption in virtualized heterogeneous data centers," *Computer Networks*, 53.17 (2009): 2888-2904.

Sego et al. "Implementing the data center energy productivity metric," *ACM Journal on Emerging Technologies in Computing Systems* (JETC), 8.4 (2012): 30.

Tang et al., "Energy-efficient thermal-aware task scheduling for homogeneous high-performance computing data centers: A cyber-physical approach," *IEEE Transactions on Parallel and Distributed Systems*, 19.11 (2008): 1458-1472.

Chinese Office Action for App. No. 201580072127.7, dated May 28, 2018, 7 pages (English translation).

European Search Report for App. No. 15 85 7800, dated Apr. 10, 2018, 13 pages.

Chinese Office Action for App. No. 20158007217.7, dated Mar. 12, 2020, 7 pages (English translation).

Chinese Office Action for App. No. 20158007217.7, dated Oct. 19, 2020, 13 pages (English translation).

\* cited by examiner

USE OF COMPUTATIONALLY GENERATED THERMAL ENERGY

CLAIM OF PRIORITY

This application is a continuation of and claims priority under 35 U.S.C. § 120 to U.S. application Ser. No. 15/299,969, filed on Oct. 21, 2016, which is a continuation of U.S. application Ser. No. 14/932,585, filed on Nov. 4, 2015, which claims priority under 35 U.S.C. § 119(e) to U.S. Patent Application Ser. No. 62/074,810, filed on Nov. 4, 2014, the entire contents of which are hereby incorporated by reference.

TECHNICAL FIELD

This description related to heat recovery systems that use computationally generated thermal energy.

BACKGROUND

Data centers consume more than 2% of all electricity generated in the US. However, most of the electricity consumed by computation devices, both at data centers and on user site, is turned into heat that dissipates into the surroundings. Residential and commercial building energy use accounts for 40% of all energy uses in the US. Currently computers are designed to minimize heat production and optimize heat dissipation, and operate solely to satisfy computation needs.

SUMMARY

Electronically executed computation is an energy intensive process. Energy consumption is particularly significant for large data centers where vast amount of computations are performed. Most of the energy consumed during the computation process—which is in the form of electrical energy—is emitted as heat energy. A heat recovery system can harness and store the heat energy generated during the computation process, and use it to satisfy energy needs for existing or future demands. The heat recovery system can be optimized to efficiently harness, store and utilize heat energy. The heat recovery system can also be configured to include a feedback system based on which the heat recovery system can modify its operation.

This application describes methods and systems of heat recovery for efficient extraction, storage and utilization of heat energy generated during a computation process. For example, the extraction and utilization rate of heat energy can be maximized by optimizing the physical position, orientation and composition of the components of the heat recovery system. This application also describes feedback systems that relay trigger event signals to one or more controllers of the heat recovery system. The trigger event signals can originate from one or more sensing devices located in the heat recovery system or from devices outside the heat recovery system. The trigger event signals can comprise information related to an increase in current or anticipated energy demand by appliances that are powered by the recovered heat energy, an expected increase in electricity prices that powers the computation process, or computation assignment that needs to be executed.

The heat recovery system can comprise one or more controllers, computation devices, energy reservoirs, building end use systems and sensing devices. The various components of the heat recovery system can be located either at the same site, or can be distributed over multiple heat recovery sites and can communicate with one another. The controllers and computation devices of the heat recovery system can also communicate with devices outside the heat recovery system through various communication channels to form a distributed computing network. The distributed computing network can run distributed applications, for example autonomous distributed building or device control systems, web services, secure peer to peer networking, distributed data management services, cloud storage, distributed databases, decentralized groups or companies, distributed trading platforms, cryptographic tokens, document processing, Turing complete virtual machines, graphics rendering, distributed accounting systems, etc.

In one aspect, a computing device-implemented method includes receiving at least one triggering event signal from one or more components of a heat recovery system. The method also includes determining, based in part on the at least one triggering event signal, a computation workload assignment to be executed on one or more computation devices. The method further includes sending one or more command signals to the one or more computation devices. The one or more command signals include a portion of the computation workload assignment for execution by the one or more computation devices. The method also includes initiating capture of heat energy to be stored in one or more heat reservoirs, the heat energy being generated by the one or more computation device based upon the computation workload assignment.

Implementation may include any or all of the following features. The one or more command signals may include information that represents type, size and execution speed of the portion of the computation workload assignment. The one or more command signals may include a request for heat generation information from the one or more computation devices. The method may include using the captured heat energy in one or more building end use systems. The received at least one triggering event signal may originate from one or more building end use systems. The received at least one triggering event signal may include information related to energy generated by a photovoltaic system. The received at least one triggering event signal may include information related to price of electricity supplied by a utility power grid. The one or more heat reservoirs may include a casing made of one or more phase change material. The one or more computation device may include a casing made of one or more phase change material.

In another aspect, a system includes a computing device with memory configured to store instructions and a processor to execute the instructions to perform operations that include receiving at least one triggering event signal from one or more components of a heat recovery system. The operations also include determining, based in part on the at least one triggering event signal, a computation workload assignment to be executed on one or more computation devices. The operations also include sending one or more command signals to the one or more computation devices. The one or more command signals include a portion of the computation workload assignment for execution by the one or more computation devices. The operations also include initiating capture of heat energy to be stored in one or more heat reservoirs, the heat energy being generated by the one or more computation device based upon the computation workload assignment.

Implementation may include any or all of the following features. The one or more command signals may include information that represents type, size and execution speed of the portion of the computation workload assignment. The one or more command signals may include a request for heat generation information from the one or more computation devices. Operations may include using the captured heat energy in one or more building end use systems. The received at least one triggering event signal may originate from one or more building end use systems. The received at least one triggering event signal may include information related to energy generated by a photovoltaic system. The received at least one triggering event signal may include information related to price of electricity supplied by a utility power grid. The one or more heat reservoirs may include a casing made of one or more phase change material. The one or more computation device may include a casing made of one or more phase change material.

In another aspect, one or more computer readable media storing instructions that are executable by a processing device, and upon such execution cause the processing device to perform operations what include receiving at least one triggering event signal from one or more components of a heat recovery system. The operations also include determining, based in part on the at least one triggering event signal, a computation workload assignment to be executed on one or more computation devices. The operations also include sending one or more command signals to the one or more computation devices. The one or more command signals include a portion of the computation workload assignment for execution by the one or more computation devices. The operations also include initiating capture of heat energy to be stored in one or more heat reservoirs, the heat energy being generated by the one or more computation device based upon the computation workload assignment.

Implementation may include any or all of the following features. The one or more command signals may include information that represents type, size and execution speed of the portion of the computation workload assignment. The one or more command signals may include a request for heat generation information from the one or more computation devices. Operations may include using the captured heat energy in one or more building end use systems. The received at least one triggering event signal may originate from one or more building end use systems. The received at least one triggering event signal may include information related to energy generated by a photovoltaic system. The received at least one triggering event signal may include information related to price of electricity supplied by a utility power grid. The one or more heat reservoirs may include a casing made of one or more phase change material. The one or more computation device may include a casing made of one or more phase change material.

These and other aspects, features and various combinations may be expressed as methods, apparatus, systems, means for performing functions, program products, and in other ways.

Other features and advantages will be apparent from the description and the claims.

DETAILED DESCRIPTION

Figure 1A:
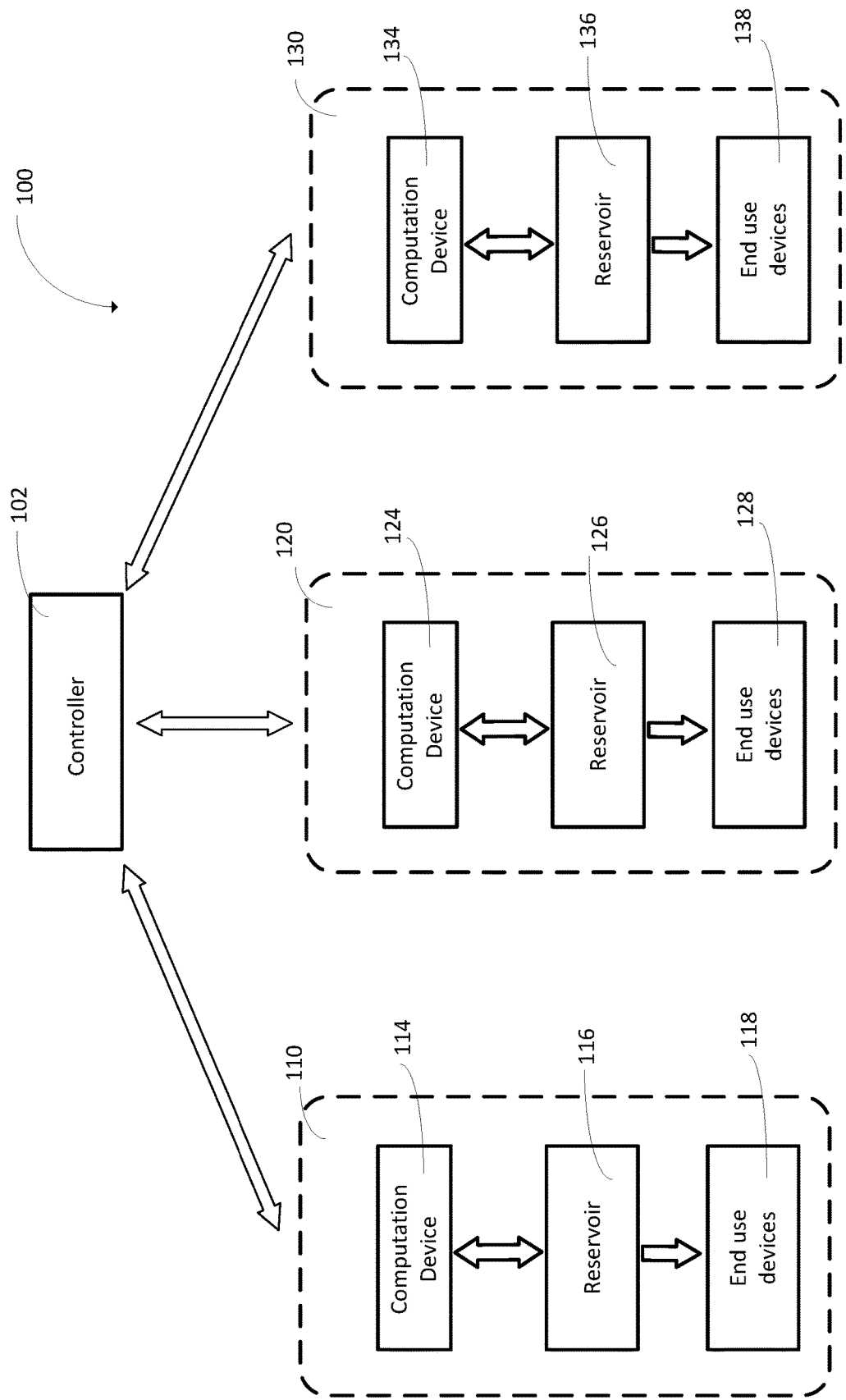
FIGS. 1A and 1B schematically illustrate a heat recovery system.

FIG. 1A illustrates a distributed heat recovery system 100 that includes a controller 102 that is configured to control the computation processes and heat recovery processes of multiple heat recovery sites 110, 120 and 130. The controller 102 can provide instructions to, and receive signals from the heat recovery sites 110, 120 and 130. The controller and the computation devices of the heat recovery system 100 can also communicate with devices that are not a part of the system 100 through communication channels (for example, the internet) to form a distributed communication network.

Heat recovery site 110 includes a computation device 114 (e.g., computing device such as a computer system, etc.), a mechanism for extraction of heat energy generated by the computation device, heat reservoir 116 and end use devices 118 that use (e.g., are powered by) energy stored in reservoir 116. The controller device 102 is communicatively coupled to computation devices 114, 124 and 134 that are located at heat recovery sites 110, 120 and 130, respectively. The controller 102 assigns the computation devices with computing assignments or requests the computing devices to provide information related to computation or heat recovery processes. The controller 102 is also configured to receive triggering event signals based on which the computation and heat recovery processes can be modified. Heat recovery sites, for example sites 110, 120 and 130, have a heat collection mechanism (not shown) that is used to transfer the heat generated by the computation devices to the reservoir 114. The reservoir 114 can comprise phase change material that can store heat energy. In other examples, the computation device, the heat collection mechanism and the reservoir can be integrated together. For example, the casing of the computation device may be filled with or constructed from phase change material that can efficiently store heat energy, or the hardware components of the computation device can be immersed in the working material of the heat reservoir. By storing thermal energy for future consumption, for example by end use devices 118, 128 and 138, the energy reservoir enables decoupling of processes associated with generation and consumption of heat energy. This results in the stabilization of temperature of the computing device. In what follows, various components of the heat recovery system 100, such as controller, computation device, heat reservoir, end use devices and sensing devices are discussed.

Figure 1B:
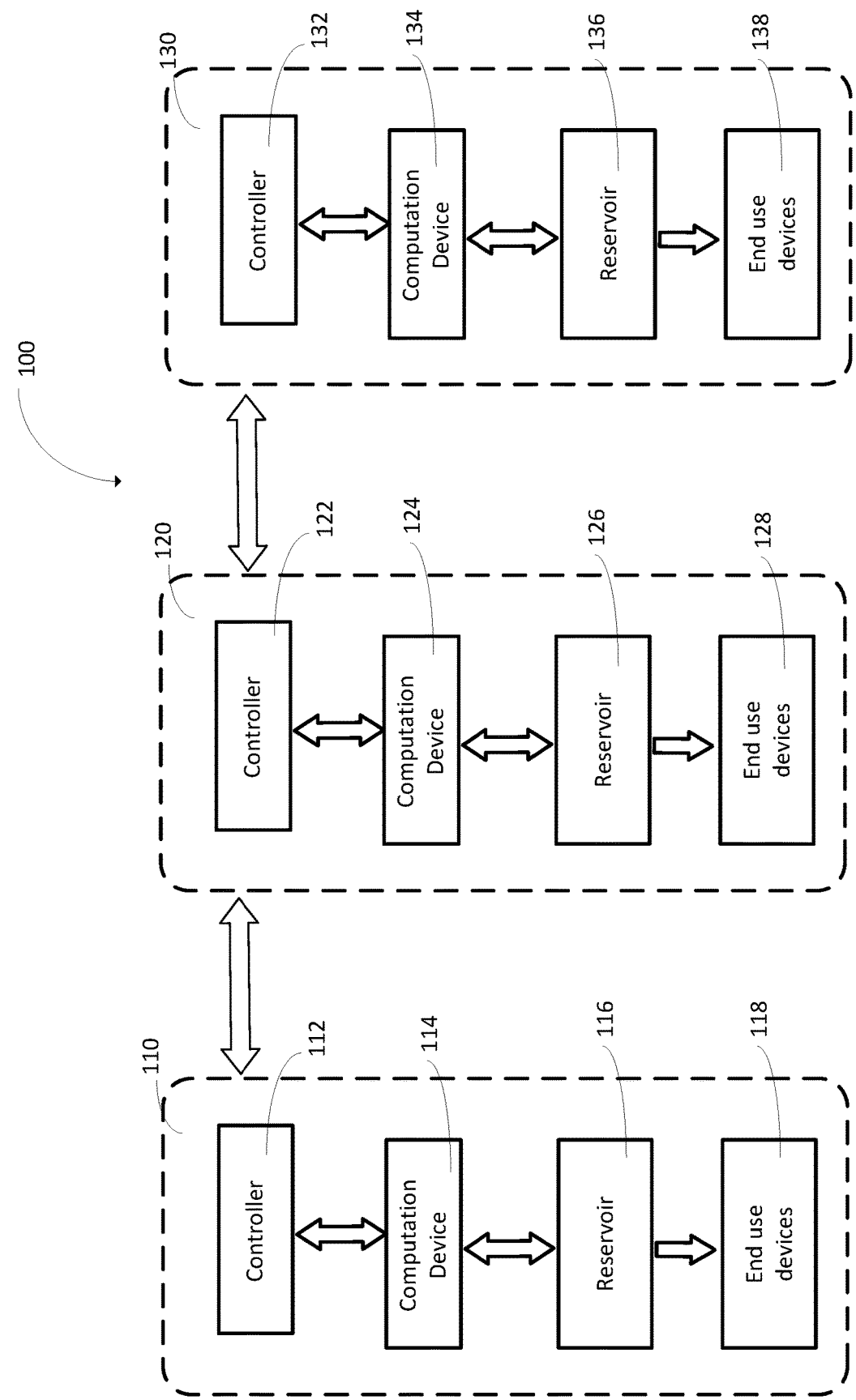

In the embodiment of the heat recovery system described in FIG. 1A, a single controller controls the computation processes and heat recovery mechanism of several heat recovery sites. FIG. 1B on the other hand, illustrates another embodiment of heat recovery system 100 where each heat recovery site 110, 120 and 130, has a local controller 112, 122 and 132, respectively. Therefore, as shown in FIGS. 1A and 1B, the controller can either be located remotely (as in FIG. 1A) or integrated into the heat recovery sites (as in FIG. 1B). In both cases, the controller relays commands or information related to heat recovery process and computation assignments to the computation device. The computation assignments are based on one or more of pre-determined programmed logics in the controller, user input or trigger event signals received from one of the components of the heat recovery system, from a device in the distributed computing network or from a device outside the distributed computing network. The commands may dictate pre-scheduled and real-time computing assignments, assignment types, sizes and execution speed. The commands can include both local and distributed computing network assignments. For example, commands can include computing assignments that are entirely run on one computation device or on computation devices distributed over the distributed computing network. The commands can also relate to the heat recovery process, for example, a request to the computation device to check the charge status of the thermal reservoir, begin or end, increase or decrease computing intensity based on inputs such as real time energy costs, future demand response notifications, and sale price variations for computation locally or on the distributed computing network.

The controller can determine computation workload assignment that can be relayed/transmitted to the computation device that generates heat during execution of the assigned workload. The generated heat energy is collected at the computation device and transported to the energy reservoir. The heat energy may be used to satisfy energy demands of building end use systems. The heat recovery sites include building end use systems, for example, space and water heating, space cooling, refrigeration, and lighting systems. The site can also include a computation device (for example, a computer system) having a heat transfer and heat storage mechanism incorporated directly into the site's building end use systems so the thermal energy generated at and collected from the computation device may be applied directly to satisfy building needs, at desirable times. The site also includes sensing mechanisms incorporated into the site's building end use systems that can transmit conditions of building end use system to the controller and provides feedback to aid in continuous determination of workload assignment.

The controller can be programmed and configured to receive triggering event signals from heat recovery sites, devices located outside the heat recovery system or from distributed applications (applications that are run over the distributed computing network). Triggering event signals contain information about the existing and anticipated future computation and energy demands. A triggering event can be, for example, a low thermal charge in the energy reservoirs or predictive thermal or computation load management inputs. Triggering event signals can be based on demand for thermal energy or future demand events by the utility company that would require charging or pre-charging the energy reservoirs to offset the utility load or a change in the market value of the distributed computation in the future. The energy demand of heat recovery site comes from building end use systems, including space and water heating, space cooling, and refrigeration.

The controller determines computation workload platforms, assignment, type, size, schedule, sequence, speed, based on received triggering event signals. The controller then relays and transmits computation workload commands to computation devices, and dynamically re-determines computation workload assignment based on additional, latest signals received and previous commands sent to computation devices. The workload assignment may also include instructions related to the initiation of the computation process. For example, the controller may instruct the computation devices to start the computation process at a certain time.

The computation device may operate as a node in the distributed computing network. For example, computation devices 114, 124 and 134 may operate as nodes on a distributed computing network that can confirm transactions between each other or with other devices on the network on a cryptographically-secured, public ledger called a blockchain. In addition to executing assigned workloads to generate heat, each computation device can execute local workloads (workload assigned locally at the heat recovery site of the computation device) and workloads assigned via distributed computation applications. The distributed computation applications may be turing-complete which allows for their creation and operation on the distributed computing network that is independent of the individual nodes of the network. This provides for the autonomous, secure control of computing devices on the network.

The controller is capable of determining computation workload assignment platforms, type, size, schedule, sequence, speed, value based on received signals. The controller is capable of contracting, transacting, relaying and transmitting cryptographically secure workloads and commands to computation devices, and dynamically re-determining computation workload assignment based on additional signals received and previous commands sent to computation devices which may be recorded on the blockchain ledger. The heat recovery system can also include a computer system which may act as a node in the decentralized network wherein the computation device is communicatively coupled with the controller, upon receiving signals from the controller carry out the workload assigned to generate heat via electricity input, is further contained in or coupled with an energy reservoir, where energy may be drawn to satisfy immediate energy demand and future energy demand from building end use systems.

The controller may be a distributed application which is capable of autonomously receiving, contracting and transacting multiple variable triggering event signals from local site, offsite, and other distributed, decentralized applications, for present and anticipated future computation and energy demands. The local site energy demand come from building end use systems, including space and water heating, space cooling, refrigeration.

The computation device is configured to execute the computation workload assignment such as distributed climate modeling, protein folding, rendering of 3D images, machine learning or cognitive modeling. The computation workload assignment may also include cryptographic hash functions that can be used to secure, transact or host distributed applications in support of the distributed network. The computation workloads may be received from the controller and executed by the hardware components, including the CPU, GPU, memories, power supply which produce heat during execution of computation. The computation device has a thermal energy collection mechanism which collects and extracts the heat generated from the hardware components of the computation device and transports the thermal energy to the energy reservoir for immediate use and for storage for future use. The controller may regulate thermal energy generation and collection mechanisms—its start, termination, speed, energy transfer direction—based on the triggering event signals and based on signals from sensing from the energy reservoir.

As described before, running computation workload on the computation device leads to the generation of heat energy that can be harnessed and stored in an energy reservoir to power the immediate or future energy demands of the building end use systems. In order to efficiently collect the generated thermal energy, each computation device can have a heat energy collection mechanism that can be coupled with or contained within the energy reservoir. Additionally, the physical position, orientation and geometry of the components of the computation device can be designed to facilitate efficient collection of generated heat. The computation device may not be coupled to a heat extraction mechanism, and the heat produced during the computation process can be released to the local surrounding of the computation device. Alternately, the computation device can be built into a facility that requires heat. For example, the computation device can be coupled to a water heater thereby heating water during computation.

The mechanism to collect the generated heat energy can be made more efficient. For example, the heat energy collection and transfer mechanism can use immersion of the hardware components of the computation device in a working material (liquid, gaseous, crystalline or solid phase-change material). The relative positioning of the hardware components of the computation device can be designed to enhance the effects of natural and forced convection and the creation of a "thermal chimney" in the computation device casing. The energy reservoir, that is coupled to or contains the computation device, can be configured to contain a body of working material (liquid, gaseous, crystalline or solid phase-change material) for the purpose of thermally stabilizing the components of the computing device. The computation device's enclosure may also be constructed from phase change materials for the purpose of removing and storing large amounts of thermal energy until it is drawn and used to satisfy building end use energy demands. The energy reservoir is also configured to have temperature, pressure and other sensing mechanisms that send signals back to the controller to augment and guide the determination of appropriate workload and assignments for computation devices. The energy reservoir is also configured to connect to the building end use systems and components so they can utilize the thermal energy stored in the energy reservoir based on demand for energy.

A computation device design considerations can include selection of computation components that maximize the generation of heat energy and optimize the collection (mechanism and process efficiency) of generated heat. The goals for the design considerations include increasing control over the capacity and rate of heat generation, increasing the heat exchange or computing efficiency, and eliminating the need for additional components, such as pumps, to assist the heat collection mechanism because additional components themselves may draw energy. The additional components may be harder to control and may require extra maintenance efforts.

Design considerations, such as relative positioning, distances, order and configuration of the components of the computation device, can be optimized to enhance the effects of natural and forced convection, and facilitate the creation of a "thermal chimney" or stack effect. By optimizing the aforementioned design considerations, the flow of heat via the working material is streamlined. Further, the order in which the working material comes in contact or in proximity with computation components is optimized to maximize the temperature differences and heat exchange efficiency (surface area, configurations, distance between componentry, transfer mechanisms to increase exchange rate) between the working material and each hardware component of the computation device in its path. The components of the computation device are arranged such that the thermal energy collected by the heat exchange medium from the components contributes to the fluid buoyancy as it experiences temperature gain and carries the thermal energy to and through the reservoir. The design of the heat exchanger which extracts the thermal energy also contributes to the convective flow through the heat chimney as the heat transfer medium gains density as heat is extracted, reinforcing the convective effect through the thermal chimney.

The heat collection mechanism in the computation device employs indirect heat collection (via convection, for example, by contact with cooling blocks or radiators) and direct heat collection (via conduction and radiation, for example immersion of computation components into working material) and a combination of heat transfer forms. The heat energy collected by the heat collection mechanism is transported to the energy reservoir directly or via a heat transfer medium such as water, glycol, oil or silicon fluids. The transport process may be facilitated by physical piping and fittings and pumping devices.

The heat energy reservoir and computation device casing may be filled with or constructed of one or more phase change materials, such as paraffin and fatty acids, to optimize the amount of stored thermal energy and regulate or augment the reservoir's temperature. Several types of phase change material may be used in the heat reservoir to stratify the heat stored into different temperature layers and allow for the extraction and storage of heat energy at different temperatures from different strata of the heat energy reservoir. For example, a stratified reservoir may contain fatty acid layers of varied contents; the contents may be modified by additions of nano-scaled carbons and metal modifiers or the device casing may be constructed of phase change materials arranged and optimized for the different operating temperatures of the internal components. The extracted heat can then be used to supply heat of differing temperatures to the end use building systems or appliances depending on the strata of thermal storage medium it is coupled.

The energy reservoir and computation device can thermally and physically incorporated into existing building end use systems and appliances. The energy reservoir and computation device can also be a stand-alone component that integrates various building end use systems. There are a large variety of building end use systems, including HVAC and refrigeration systems that may draw from the thermal energy reservoir to satisfy a building energy load.

The heat recovery site has building end use systems including space and water heating, space cooling, refrigeration and semiconductor based lighting systems. The heat recovery system's heat transfer and heat storage mechanism is incorporated into the site's building end use systems so the thermal energy collected from the computation device or lighting systems may be transported to satisfy building needs, at desirable times. The building end use systems and components incorporate sensing mechanisms so that signals communicating the conditions of the systems and components may be transmitted to the controller and provides feedback to aid in continuous determination of workload assignment.

As described earlier, the control in the heat recovery system 100 is configured to receive triggering event signals sent by various components of the heat recovery system 100. For example, triggering event signals can originate from one or more sensors that are located in computation devices, heat reservoirs and building end use systems.

Triggering events are sets of conditions determined or programmed into the one or more controller of the heat recovery system. When these conditions are met, the controller can initiate the procedures of workload determination and transact some quantity of a token representing the value of services being exchanged as a result of the conditions being met, signaling a computing device to start computation. Triggering events could be demand for heat by the building end use systems, a lower than optimal temperature in the thermal energy reservoir, a predicted shortfall of heat based on predictive load management algorithms, grid responsive load management taking into account weather, grid conditions, energy or computation price signals or demand response.

There are many possibilities for triggering events for the heat recovery system. Triggering event signals can be categorized by where the signals originated from and what the conditions are that lead to the generation of triggering event signals. After a triggering event occurs, the controller can identify and optimize the distribution of computational workload to power building end use devices available across the distributed computing network to achieve the desirable output profile. The desired output profile may be a measure and optimization of the multifactor productivity of a combination of inputs such as, building's location, current state of thermal storage charge, predicted heat load requirements, building lighting requirements, current or predicted value of computation, current and predicted utility grid conditions, ancillary services incentives, renewable energy production, value of cryptographically secure data transmission and storage, and others. In this sense, the outputs include both the computation tasks performed and the thermal energy generated that may be utilized for various end uses at various favorable time and location and other factors.

Triggering events can lead to workload determination and assignment by the local or distributed network controller, and subsequently to execution of computation by the computation device. The thermal energy generated from the computation device is collected, transported and stored in the energy reservoir. The thermal energy accumulated at the energy reservoir can be used immediately or at a later time to power any of building systems, applications and appliances. Even though triggering events initiates the computation, they may not influence the usage of stored heat energy.

Triggering event signals that lead to the optimization of the operation of the heat recovery system can include a direct communication from building energy systems, feedback from heuristic appliances and building equipment. Triggering event signals can also include information about favorable energy or computation pricing, anticipation of grid events, and alignment with and firming of renewable energy generation patterns by most effectively using their intermittent energy production. The primary purpose of having triggering events signals is to allow the heat recovery system to be as flexible and adaptive as possible to environmental, economic, community, building, distributed computing network and operator needs.

The trigger event signals from the various components of the heat recovery system can contain data on temperature, air quality indicators (for example CO2 level), pressure, weight, time of day, light level, etc. For example, when connected with and used for the building's hot water system, the triggering condition could be when the temperature in the thermal reservoir (for example storage tank) that provides hot water is below 120° F. For example, the temperature of hot water may drop below 120° F. at 5 am every morning. It can also be a combination of conditions. When the triggering conditions are met based on signal input, the controller sends the command to the computation device notifying it of the computation assignments to perform, how quickly to ramp up, and how long to perform computation. The controller could iteratively modify the command based on sensor feedback from the building end use appliances and information received from the distributed computing network. For example, for a hot water system, the feedback can whether the hot water in the tank has reached the pre-set temperature.

Triggering events can be calls for computation needs that can be local and remote (with respective to the location of the heat recovery system). For example, whenever a heat recovery site occupant uses the computing device to perform Excel calculations or stream video content, the computation device performs the tasks as directed, and thermal energy is generated, collected and stored in the energy reservoir. Likewise, when a remote computation call occurs—for example, from a remote computation device on the distributed computing network—the controller determines whether multiple variables, price and task duration parameters have been met and transacted, and then calls upon the computation device to perform the tasks. Heat generated from the computation can be collected and stored in the energy reservoir for end uses.

Another type of triggering event originating from the site can be motivated by alignment with renewable generation on site. For example, in instances when excess electrical energy is generated by an onsite rooftop photovoltaic (PV) system, the controller can dictate that the electric energy (DC or AC) should be used to power the computation device, transact computation on the distributed network and effectively store the generated heat energy in the thermal energy reservoir. Most batteries used for distributed renewable generation in the market today are electrochemical. It can be considered easier, cheaper and efficient to store energy, for building end use, in thermal form rather than electrochemical form. In heat recovery system, the onsite renewable generation sizing will no longer be constrained by the maximum building load, and therefore, its operation will no longer be restricted to when there is a matching building electricity load or need on the grid (via net metering).

Triggering event signals can also originate from outside the heat recovery system, and can contain data on pricing of electricity supplied by utility power grid, utility power grid conditions, weather conditions, etc. For example, the triggering events could be set as certain energy or demand pricing. When the price of electricity that supplies energy to the computation device is below a threshold (pre-set or determined based on certain method), the controller will call and transact a suitable computation workload from the distributed computing network and prompt the computation device to perform computation. The thermal energy generated from the computation can be used during a later time when electricity price is higher.

Triggering event can also be designed such that the heat recovery system anticipates or responds to a combination of power grid and weather conditions. For example, it can be forecasted that a major storm will pass through the region in which the system resides, and that the power generation/distribution system would experience disruption in service availability and reliability. The forecast can be based on signals such as the atmospheric pressure or precipitation level at offsite locations and weather forecasts for the region. The controller will prompt the computation to kick in ahead of the forecasted weather event, transacting the benefit of computation to the distributed computing network at a reduced price to minimize impact from such disruptions on the building and end users.

In another triggering event scenario, the controller may command the computation device to dynamically start and terminate computation based on the goal of equalizing power generating and demand load profile. For example, the triggering conditions may be data on the weather pattern and operation conditions of a large utilize-scaled solar photovoltaic (PV) farm. When such a relatively large renewable "power plant" goes on/offline or changes the power output unavoidably due to insolation or other parameter changes, the controller can be configured to receive real-time weather and inverter data and determine the course of action accordingly. In this example, the heat recovery system installed and in operation at various locations across the generation, transmission, and distribution infrastructure areas effectively acts as flexible, responsive energy storage capabilities to be called into action whenever the need arises.

Like the power grid system infrastructure, the information system infrastructure can also experience disturbances. Examples of disturbances can include damages to delivery infrastructure or interruptions in data center operations. In this example, the controller determines a need for data storage, transmission or computation via the distributed computing network, and sends command to control the computation device to perform computations, store or recall stored data, or operate in as a peer to peer data transmission network so to act as redundancy support. The use of the combined heat recovery system can also be triggered by considerations on data transmission bandwidth, speed and prioritization. For example, the controller could receive signals from the distributed computation network indicating a constraint in network bandwidth between specific nodes, autonomously determine and settle transaction parameters to alleviate the constraint by optimizing communications and data storage between nodes on the distributed network and initiate commands to perform data storage computation tasks between devices on the distributed computing network. The timing, content and size of the locally stored data may be motivated by ease, distance and frequency of use and further data transmission needs from the system.

In addition to providing heat energy for building end use, the modular nature of the system and high density, phase change thermal storage systems will make it possible to generate and transport thermally stored energy. The modularly designed systems may be scaled up and down depending on economics and building needs. Beneficial market dynamics may encourage the transport of computationally generated thermal energy to other facilities to serve building loads or for use in manufacturing, industrial processes and other purposes.

The computation and heat recovery system can be used as a local platform on which developers can provide secure distributed applications to interact with a building's systems, appliances and inhabitants. These applications could automate and control the building systems as well as replace numerous consumer electronic devices such as computers, set top boxes, DVRs, alarm systems, or any device which uses microprocessors or data storage whose benefits could be provided by the appliance. The computation and heat recovery system can serve as a unifying platform for the connected smart home, automating and transacting the benefits of distributed computation, ancillary services, renewables firming, adaptive load control of smart appliances (such as grid responsive water heaters), thermostats, electric car charging. The system is well suited for peer to peer, internet of things and sharing economy services such as data storage, streaming video, audio, virtual computing and gaming services and other benefits to truly become an interactive and distributed resource of the smart grid.

There may be times when the value of computation, the price of electricity and other influences make it beneficial to use thermally generated electricity by thermoelectric effect. Devices employing principles such as Organic Rankin Cycle, Stirling Cycle, Peltier effect modules and others could be used to convert excess heat generated through computation back into electricity for immediate use onsite, storage for later use and supplied to the local utility grid.

In one embodiment of heat recovery system, semiconductor based (LED) or other heat generating lighting system components may be incorporated into the thermal storage system. Lighting components generate significant heat which could be recovered by the system and used to power building thermal loads. In this case the heat generating components would be incorporated into the appropriate temperature strata of the computation device or as a separate lighting device connected to or incorporated in the thermal storage system. The light generated could be transported through fiber optic cable or other mechanism to the areas requiring light and the heat generated would be captured to serve building loads.

Figure 2A:
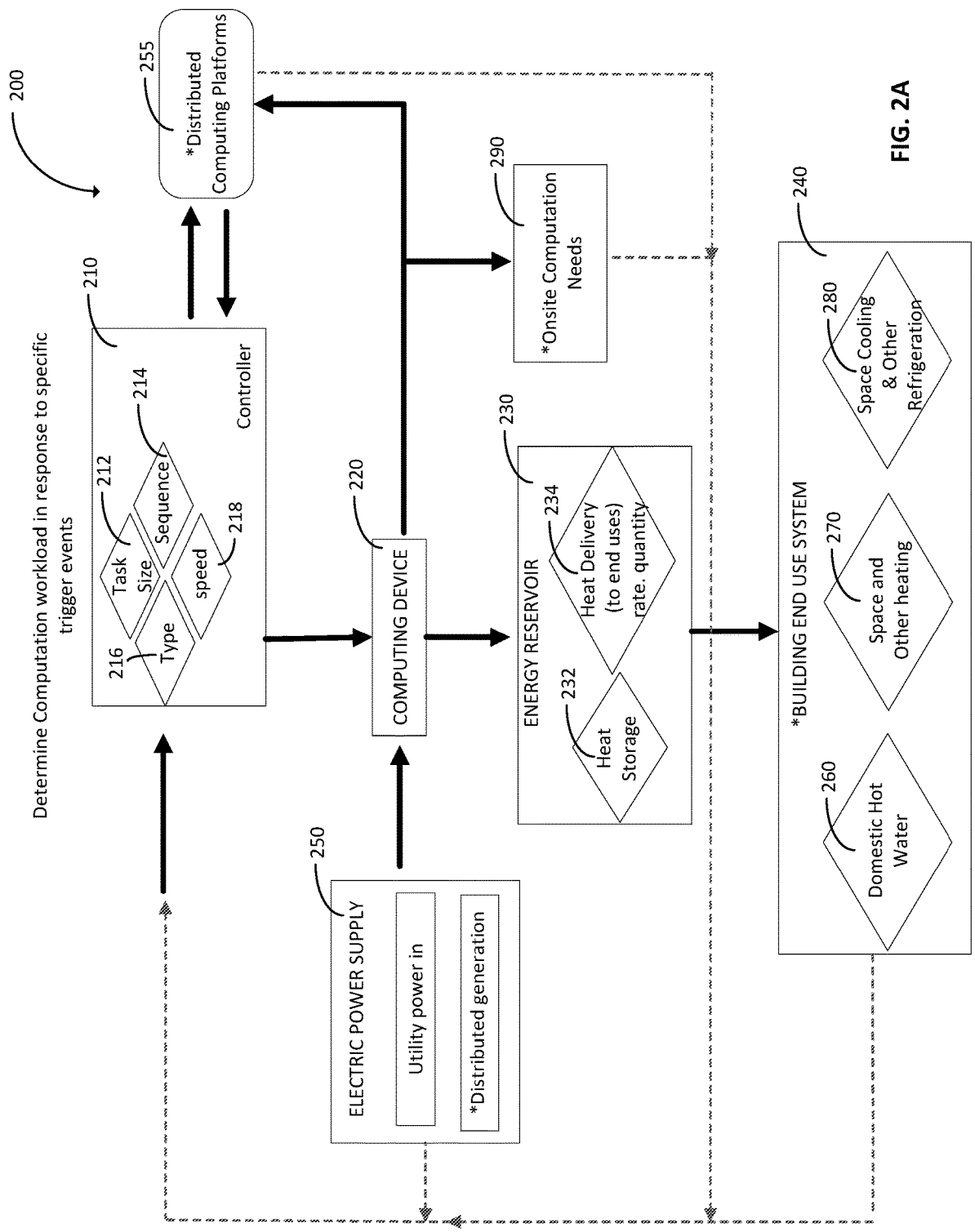
FIG. 2A is a schematic representation of the working of the heat recovery system.

FIG. 2A is a schematic representation of the working of the heat recovery system 200 (similar to heat recovery system 100). The heat recovery system comprises a controller 210 (similar to controller 102) that is configured to receive trigger event signals and provide commands and computation assignments to the computing device 220 (similar to computing device 114). The commands may dictate pre-scheduled and real-time computing assignments with assignment type 216, assignment size 212, assignment sequence 214, and assignment execution speed 218. The controller can also communicate with other distributed computing platforms 255, for example, through the internet that are part of the distributed computing network. The computing device 220 receives commands and computation assignments from the controller 210 and outputs the computation results that are used to satisfy onsite computation needs 290 or sent to the distributed computing platforms 255. The computation device 220 can also convey information related to the heat generation or computation process to the controller 210. The computation device draws electrical energy from the electric power supply 250 (for example, utility power grid) and releases thermal energy to the energy reservoir 230 (similar to reservoir 116). The energy reservoir is configured to store heat energy 232, and has mechanisms 234 to deliver the stored heat energy to the building end use system 240 (similar to end use devices 118). The build end use system can comprise hot water system 260, space and other heating appliances 270 and space cooling and other cooling appliances 280. The controller is configured to receive trigger event signals from energy reservoir 230, building end use systems 240, electric power supply 250, distributed computing platforms 255 and onsite computation needs 290.

Figure 2B:
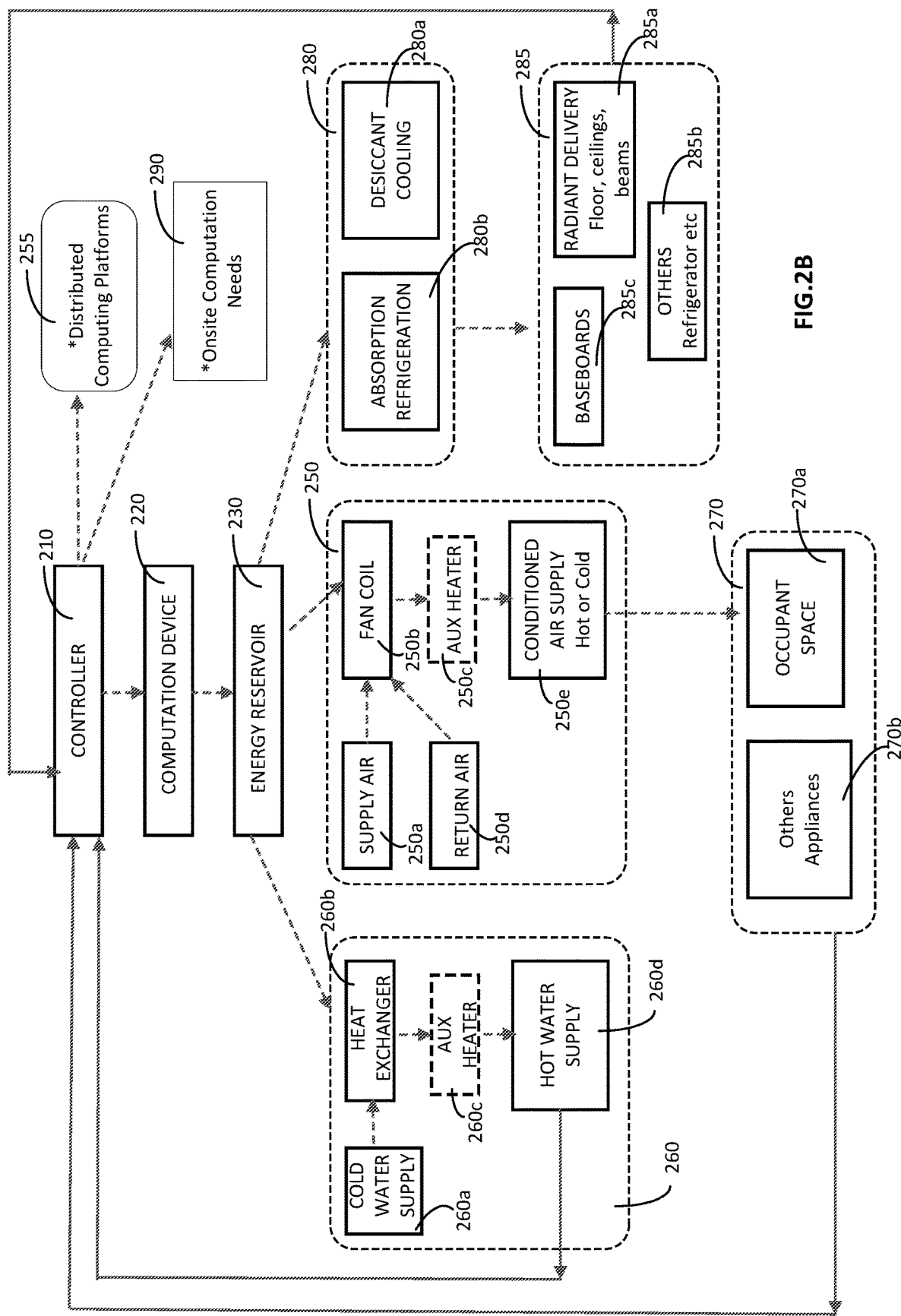
FIG. 2B is a schematic representation of the building end use system of a heat recovery system.

FIG. 2B is a schematic illustration of the building end use system of the heat recovery system 200. As described in FIG. 2A, the heat recovery system 200 comprises controller 210, computing device 220 and energy reservoir 230. The controller 210 receives triggering event signals and sends computational output to distributed computing platform 255 and to satisfy onsite computation needs 290. The building end use system comprises forced-air delivery 250, hot water system 260, space and other heating system 270, space and other cooling system 280 and hydronic delivery system 285. The forced-air deliver system comprises air supply 250a, fan coil 250b, auxiliary heater 250c, return air supply 250d and the conditioned air supply 250e. The hot water system 260 comprises cold water supply 260a, heat exchanger 260b, auxiliary heater 260c and hot water supply tank 260d. The space and other heating system 270 comprises the occupant space heating system 270a and systems 270b for heating pool, hot tub, sauna and for ice removal. The space and other cooling system comprises desiccant cooling system 280a and absorption refrigeration system 280b. The hydronic delivery system 285 comprises radiant delivery system 285a, refrigerators 285b, and baseboards 285c. The building end use systems receive energy from the energy reservoir and send trigger event signal to the controller 210. For example, the hot water supply tank 260d can send a signal to the controller if the temperature of the water falls below a certain value, for example, 120° F. The HVAC system 250 can signal the controller that cooling 280, 285a/b, or heating load 285a/c has increased prompting the generation of additional heat. A building management system can be programmed to signal the controller 210 of current and predicted heat load requirements of any building systems, dynamically and predictively controlling the generation and storage of heat at various temperatures.

Figure 3:
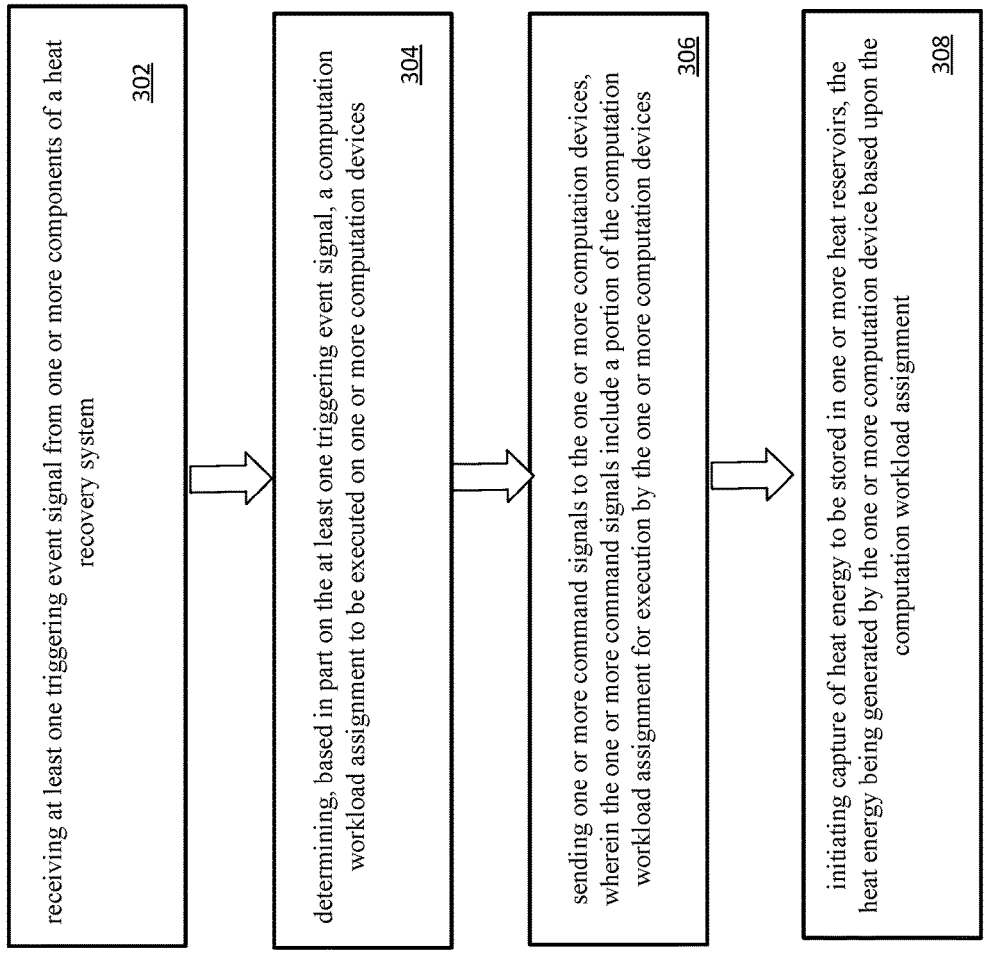
FIG. 3 illustrates a flowchart that describes the heat recovery process.

FIG. 3 illustrates a flowchart 300 which represents the operation of a controller of a heat recovery system, for example, controllers 102, 112, 122, 132 and 210 in heat recovery systems 100 and 200 of FIGS. 1A, 1B, 2A and 2B. The controller receives 302 at least one triggering event signal from one or more components of the heat recovery system. For example, the triggering signal may originate from one of the components of the heat recovery system, e.g., the reservoir 116, the end use devices 118, etc. The triggering signal may originate from an onsite computation need 290, an offsite distributed computing platform (e.g., platform 255), a power supply (e.g., electric power supply 250), etc. Based on the received triggering event signal, the controller determines 304 a computation workload assignment to be executed on one or more computation devices. Determining the computation workload assignment can involve determining assignment type 216, assignment size 212, assignment sequence 214, and assignment execution speed 218. The controller can then send 306 one or more command signals to one or more computation devices in the heat recovery system. The command signals may include information, e.g., related to assignment type 216, assignment size 212, assignment sequence 214, and assignment execution speed 218. The command signals can also include a portion of the workload assignment to be executed by the one or more computation devices (for example, computation device 114, 124, 134 or 220). Then, the heat energy capture process is initiated 308 by the controller: as the computation device executes the workload assignments assigned to it by the controller, heat is generated which can be captured and stored in the heat reservoirs (for example, heat reservoirs 116, 126, 136 and 230).

Figure 4:
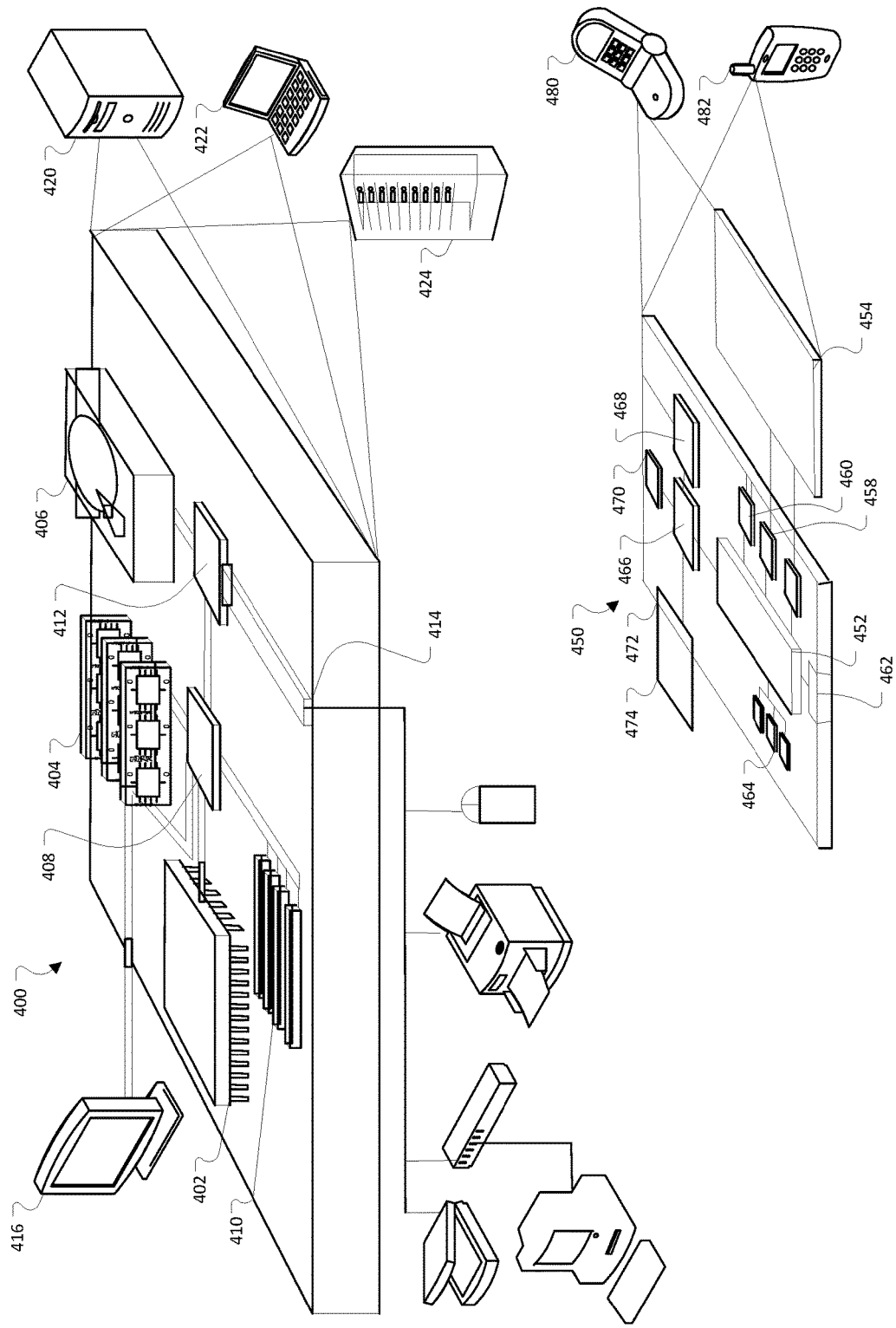
FIG. 4 illustrates an example of a computing device and a mobile computing device that can be used to implement the techniques described here.

FIG. 4 shows an example of example computing device 400 and example mobile computing device 450, which can be used to implement one or more of the techniques described herein. For example, a portion or all of the operations of controller, computation device (shown in FIG. 1) may be executed by the computing device 400 and/or the mobile computing device 450. Computing device 400 is intended to represent various forms of digital computers, including, e.g., laptops, desktops, workstations, personal digital assistants, servers, blade servers, mainframes, and other appropriate computers. Computing device 450 is intended to represent various forms of mobile devices, including, e.g., personal digital assistants, tablet computing devices, cellular telephones, smartphones, and other similar computing devices. The components shown here, their connections and relationships, and their functions, are meant to be examples only, and are not meant to limit implementations of the techniques described and/or claimed in this document.

Computing device 400 includes processor 402, memory 404, storage device 406, high-speed interface 408 connecting to memory 404 and high-speed expansion ports 410, and low speed interface 412 connecting to low speed bus 414 and storage device 406. Each of components 402, 404, 406, 408, 410, and 412, are interconnected using various busses, and can be mounted on a common motherboard or in other manners as appropriate. Processor 402 can process instructions for execution within computing device 400, including instructions stored in memory 404 or on storage device 406 to display graphical data for a GUI on an external input/output device, including, e.g., display 416 coupled to high speed interface 408. In other implementations, multiple processors and/or multiple busses can be used, as appropriate, along with multiple memories and types of memory. Also, multiple computing devices 400 can be connected, with each device providing portions of the necessary operations (e.g., as a server bank, a group of blade servers, or a multi-processor system).

Memory 404 stores data within computing device 400. In one implementation, memory 404 is a volatile memory unit or units. In another implementation, memory 404 is a non-volatile memory unit or units. Memory 404 also can be another form of computer-readable medium (e.g., a magnetic or optical disk. Memory 404 may be non-transitory.)

Storage device 406 is capable of providing mass storage for computing device 400. In one implementation, storage device 406 can be or contain a computer-readable medium (e.g., a floppy disk device, a hard disk device, an optical disk device, or a tape device, a flash memory or other similar solid state memory device, or an array of devices, such as devices in a storage area network or other configurations.) A computer program product can be tangibly embodied in a data carrier. The computer program product also can contain instructions that, when executed, perform one or more methods (e.g., those described above.) The data carrier is a computer- or machine-readable medium, (e.g., memory 404, storage device 406, memory on processor 1302, and the like.)

High-speed controller 408 manages bandwidth-intensive operations for computing device 1300, while low speed controller 412 manages lower bandwidth-intensive operations. Such allocation of functions is an example only. In one implementation, high-speed controller 1308 is coupled to memory 404, display 416 (e.g., through a graphics processor or accelerator), and to high-speed expansion ports 410, which can accept various expansion cards (not shown). In the implementation, low-speed controller 412 is coupled to storage device 406 and low-speed expansion port 414. The low-speed expansion port, which can include various communication ports (e.g., USB, Bluetooth®, Ethernet, wireless Ethernet), can be coupled to one or more input/output devices, (e.g., a keyboard, a pointing device, a scanner, or a networking device including a switch or router, e.g., through a network adapter.)

Computing device 400 can be implemented in a number of different forms, as shown in the figure. For example, it can be implemented as standard server 420, or multiple times in a group of such servers. It also can be implemented as part of rack server system 424. In addition or as an alternative, it can be implemented in a personal computer (e.g., laptop computer 422.) In some examples, components from computing device 400 can be combined with other components in a mobile device (not shown), e.g., device 450. Each of such devices can contain one or more of computing device 400, 450, and an entire system can be made up of multiple computing devices 400, 450 communicating with each other.

Computing device 450 includes processor 452, memory 464, an input/output device (e.g., display 454, communication interface 466, and transceiver 468) among other components. Device 450 also can be provided with a storage device, (e.g., a microdrive or other device) to provide additional storage. Each of components 450, 452, 464, 454, 466, and 468, are interconnected using various buses, and several of the components can be mounted on a common motherboard or in other manners as appropriate.

Processor 452 can execute instructions within computing device 450, including instructions stored in memory 464. The processor can be implemented as a chipset of chips that include separate and multiple analog and digital processors. The processor can provide, for example, for coordination of the other components of device 450, e.g., control of user interfaces, applications run by device 450, and wireless communication by device 450.

Processor 452 can communicate with a user through control interface 458 and display interface 456 coupled to display 454. Display 454 can be, for example, a TFT LCD (Thin-Film-Transistor Liquid Crystal Display) or an OLED (Organic Light Emitting Diode) display, or other appropriate display technology. Display interface 456 can comprise appropriate circuitry for driving display 454 to present graphical and other data to a user. Control interface 458 can receive commands from a user and convert them for submission to processor 452. In addition, external interface 462 can communicate with processor 442, so as to enable near area communication of device 450 with other devices. External interface 462 can provide, for example, for wired communication in some implementations, or for wireless communication in other implementations, and multiple interfaces also can be used.

Memory 464 stores data within computing device 450. Memory 464 can be implemented as one or more of a computer-readable medium or media, a volatile memory unit or units, or a non-volatile memory unit or units. Expansion memory 474 also can be provided and connected to device 450 through expansion interface 472, which can include, for example, a SIMM (Single In Line Memory Module) card interface. Such expansion memory 474 can provide extra storage space for device 450, or also can store applications or other data for device 450. Specifically, expansion memory 474 can include instructions to carry out or supplement the processes described above, and can include secure data also. Thus, for example, expansion memory 474 can be provided as a security module for device 450, and can be programmed with instructions that permit secure use of device 450. In addition, secure applications can be provided through the SIMM cards, along with additional data, (e.g., placing identifying data on the SIMM card in a non-hackable manner.)

The memory can include, for example, flash memory and/or NVRAM memory, as discussed below. In one implementation, a computer program product is tangibly embodied in a data carrier. The computer program product contains instructions that, when executed, perform one or more methods, e.g., those described above. The data carrier is a computer- or machine-readable medium (e.g., memory 464, expansion memory 474, and/or memory on processor 452), which can be received, for example, over transceiver 468 or external interface 462.

Device 450 can communicate wirelessly through communication interface 466, which can include digital signal processing circuitry where necessary. Communication interface 466 can provide for communications under various modes or protocols (e.g., GSM voice calls, SMS, EMS, or MMS messaging, CDMA, TDMA, PDC, WCDMA, CDMA2000, or GPRS, among others.) Such communication can occur, for example, through radio-frequency transceiver 468. In addition, short-range communication can occur, e.g., using a Bluetooth®, WiFi, or other such transceiver (not shown). In addition, GPS (Global Positioning System) receiver module 470 can provide additional navigation- and location-related wireless data to device 450, which can be used as appropriate by applications running on device 450. Sensors and modules such as cameras, microphones, compasses, accelerators (for orientation sensing), etc. may be included in the device.

Device 450 also can communicate audibly using audio codec 460, which can receive spoken data from a user and convert it to usable digital data. Audio codec 460 can likewise generate audible sound for a user, (e.g., through a speaker in a handset of device 450.) Such sound can include sound from voice telephone calls, can include recorded sound (e.g., voice messages, music files, and the like) and also can include sound generated by applications operating on device 450.

Computing device 450 can be implemented in a number of different forms, as shown in the figure. For example, it can be implemented as cellular telephone 480. It also can be implemented as part of smartphone 482, a personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor. The programmable processor can be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to a computer program product, apparatus and/or device (e.g., magnetic discs, optical disks, memory, Programmable Logic Devices (PLDs)) used to provide machine instructions and/or data to a programmable processor, including a machine-readable medium that receives machine instructions.

To provide for interaction with a user, the systems and techniques described here can be implemented on a computer having a device for displaying data to the user (e.g., a CRT (cathode ray tube) or LCD (liquid crystal display) monitor), and a keyboard and a pointing device (e.g., a mouse or a trackball) by which the user can provide input to the computer. Other kinds of devices can be used to provide for interaction with a user as well; for example, feedback provided to the user can be a form of sensory feedback (e.g., visual feedback, auditory feedback, or tactile feedback); and input from the user can be received in a form, including acoustic, speech, or tactile input.

The systems and techniques described here can be implemented in a computing system that includes a backend component (e.g., as a data server), or that includes a middleware component (e.g., an application server), or that includes a frontend component (e.g., a client computer having a user interface or a Web browser through which a user can interact with an implementation of the systems and techniques described here), or a combination of such back end, middleware, or frontend components. The components of the system can be interconnected by a form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

In some implementations, the engines described herein can be separated, combined or incorporated into a single or combined engine. The engines depicted in the figures are not intended to limit the systems described here to the software architectures shown in the figures.

A number of embodiments have been described. Nevertheless, it will be understood that various modifications can be made without departing from the spirit and scope of the processes and techniques described herein. In addition, the logic flows depicted in the figures do not require the particular order shown, or sequential order, to achieve desirable results. In addition, other steps can be provided, or steps can be eliminated, from the described flows, and other components can be added to, or removed from, the described systems. Accordingly, other embodiments are within the scope of the following claims.

What is claimed is:

1. A computing device-implemented method comprising:
   predictively determining a demand for thermal energy;
   determining a computation workload assignment to be executed on one or more computation devices having a machine learning capability;
   sending one or more command signals to the one or more computation devices, wherein the one or more command signals include a portion of the computation workload assignment for execution by the one or more computation devices; and
   initiating capture of thermal energy to be stored in one or more thermal energy reservoirs for satisfying the predicted thermal energy demand, the thermal energy being generated by the one or more computation devices based upon the computation workload assignment.

2. The computing device-implemented method in claim 1, wherein the one or more command signals include information that represents type, size and execution speed of the portion of the computation workload assignment.

3. The computing device-implemented method of claim 1, wherein the one or more command signals include a request for thermal energy generation information from the one or more computation devices.

4. The computing device-implemented method of claim 1, further comprising using the captured thermal energy in one or more building end use systems.

5. The computing device-implemented method of claim 1, wherein the one or more thermal energy reservoirs include a casing made of one or more phase change material.

6. The computing device-implemented method of claim 1, wherein the one or more computation devices include a casing made of one or more phase change material.

7. The computing device-implemented method in claim 1, wherein the thermal energy recovery system comprises a cooling system.

8. The computing device-implemented method in claim 1, wherein the predictive determination is performed by the one or more computation devices at a thermal energy recovery site.

9. The computing device-implemented method in claim 1, wherein the predictive determination is performed in a distributed manner.

10. The computing device-implemented method of claim 1, wherein the computing device is one of the one or more computation devices.

11. The computing device-implemented method of claim 1, wherein determining the computation workload assignment comprises predictively determining the computation workload assignment.

12. The computing device-implemented method of claim 1, wherein the computing device uses cryptographic tokens to define a decentralized entity.

13. A system comprising:
    a computing device comprising:
      a memory configured to store instructions; and
      a processor to execute the instructions to perform operations comprising:
        predictively determining a demand for thermal energy;
        determining a computation workload assignment to be executed on one or more computation devices having a machine learning capability;
        sending one or more command signals to the one or more computation devices, wherein the one or more command signals include a portion of the computation workload assignment for execution by the one or more computation devices; and
        initiating capture of thermal energy to be stored in one or more thermal energy reservoirs for satisfying the predicted thermal energy demand, the thermal energy being generated by the one or more computation devices based upon the computation workload assignment.

14. The system of claim 13, wherein the one or more command signals include information that represents type, size and execution speed of the portion of the computation workload assignment.

15. The system of claim 13, wherein the one or more command signals include a request for thermal energy generation information from the one or more computation devices.

16. The system of claim 13, further comprising using the captured thermal energy in one or more building end use systems.

17. The system of claim 13, wherein the one or more thermal energy reservoirs include a casing made of one or more phase change material.

18. The system of claim 13, wherein the one or more computation devices include a casing made of one or more phase change material.

19. The system of claim 13, wherein the thermal energy recovery system comprises a cooling system.

20. The system of claim 13, wherein the predictive determination is performed by the one or more computation devices at a thermal energy recovery site.

21. The system of claim 13, wherein the predictive determination is performed in a distributed manner.

22. The system of claim 13, wherein the computing device is one of the one or more computation devices.

23. One or more non-transitory computer readable media storing instructions that are executable by a processing device, and upon such execution cause the processing device to perform operations comprising:
- predictively determining a demand for thermal energy;
- determining a computation workload assignment to be executed on one or more computation devices having a machine learning capability;
- sending one or more command signals to the one or more computation devices, wherein the one or more command signals include a portion of the computation workload assignment for execution by the one or more computation devices; and
- initiating capture of thermal energy to be stored in one or more thermal energy reservoirs for satisfying the predicted thermal energy demand, the thermal energy being generated by the one or more computation devices based upon the computation workload assignment.

24. The non-transitory computer readable media of claim 23, wherein the one or more command signals include information that represents type, size and execution speed of the portion of the computation workload assignment.

25. The non-transitory computer readable media of claim 23, wherein the thermal energy recovery system comprises a cooling system.

26. The non-transitory computer readable media of claim 23, wherein the predictive determination is performed by the one or more computation devices at a thermal energy recovery site.

27. The non-transitory computer readable media of claim 23, wherein the predictive determination is performed in a distributed manner.

28. The non-transitory computer readable media of claim 23, wherein the computing device is one of the one or more computation devices.

* * * * *

UNITED STATES PATENT AND TRADEMARK OFFICE
CERTIFICATE OF CORRECTION

PATENT NO. : 11,350,547 B2
APPLICATION NO. : 16/658759
DATED : May 31, 2022
INVENTOR(S) : Orsini et al.

It is certified that error appears in the above-identified patent and that said Letters Patent is hereby corrected as shown below:

In the Claims

Column 17, Line 57: In Claim 2, delete "in" and replace it with -- of --.

Column 18, Line 7 (approx.): In Claim 7, delete "in" and replace it with -- of --.

Column 18, Line 10 (approx.): In Claim 8, delete "in" and replace it with -- of --.

Column 18, Line 14 (approx.): In Claim 9, delete "in" and replace it with -- of --.

Signed and Sealed this
Sixteenth Day of August, 2022

Katherine Kelly Vidal
*Director of the United States Patent and Trademark Office*